US007479674B2

(12) United States Patent
Nakabayashi et al.

(10) Patent No.: US 7,479,674 B2
(45) Date of Patent: Jan. 20, 2009

(54) FIELD EFFECT TRANSISTOR

(75) Inventors: Yukio Nakabayashi, Yokohama (JP); Kazumi Nishinohara, Yokohama (JP); Atsuhiro Kinoshita, Kamakura (JP); Junji Koga, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/034,822

(22) Filed: Feb. 21, 2008

(65) Prior Publication Data

US 2008/0150040 A1    Jun. 26, 2008

Related U.S. Application Data

(62) Division of application No. 11/081,348, filed on Mar. 16, 2005, now Pat. No. 7,358,550.

(30) Foreign Application Priority Data

Mar. 26, 2004    (JP) .............................. 2004-092537

(51) Int. Cl.
*H01L 29/76* (2006.01)
(52) U.S. Cl. ...................... 257/288; 257/369
(58) Field of Classification Search ................. 257/288, 257/369
See application file for complete search history.

(56) References Cited

U.S. PATENT DOCUMENTS 6,194,748 B1    2/2001    Yu

2002/0011613 A1    1/2002    Yagishita et al.
2005/0093033 A1    5/2005    Kinoshita et al.

FOREIGN PATENT DOCUMENTS

| JP | 59-32172 | 2/1984 |
| JP | 59-047767 | 3/1984 |
| JP | 06-224428 | 8/1994 |
| JP | 2002-094058 | 3/2002 |

OTHER PUBLICATIONS

Japanese Office Action dated Oct. 24, 2006.

*Primary Examiner*—Douglas M Menz
(74) *Attorney, Agent, or Firm*—Amin, Turocy & Calvin, LLP

(57) ABSTRACT

An field effect transistor includes a first semiconductor region, a gate electrode insulatively disposed over the first semiconductor region, source and drain electrodes between which the first semiconductor region is sandwiched, and second semiconductor regions each formed between the first semiconductor region and one of the source and drain electrodes, and having impurity concentration higher than that of the first semiconductor region, the source electrode being offset to the gate electrode in a direction in which the source electrode and the drain electrode are separated from each other with respect to a channel direction, and one of the second semiconductor regions having a thickness not more than a thickness with which the one of second semiconductor regions is completely depleted in the channel direction being in thermal equilibrium with the source electrode therewith.

11 Claims, 8 Drawing Sheets

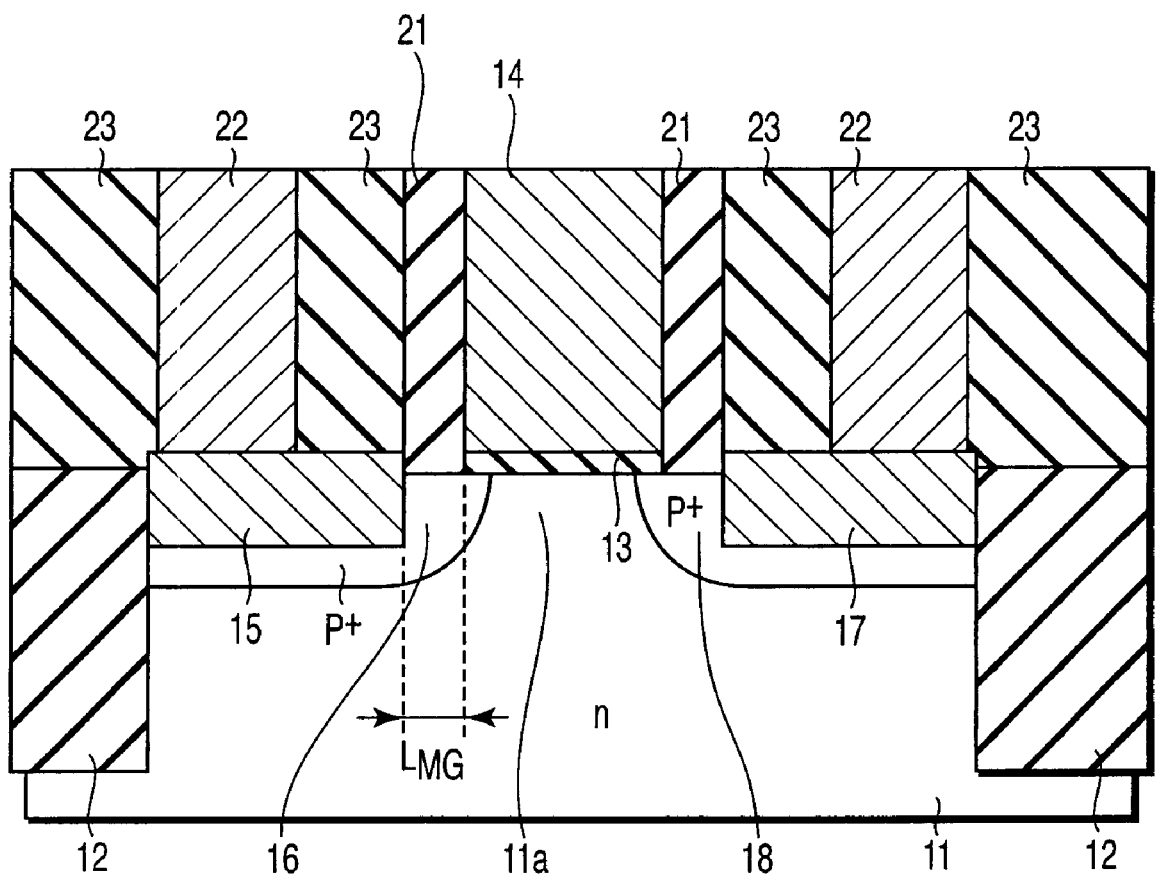
F I G. 1

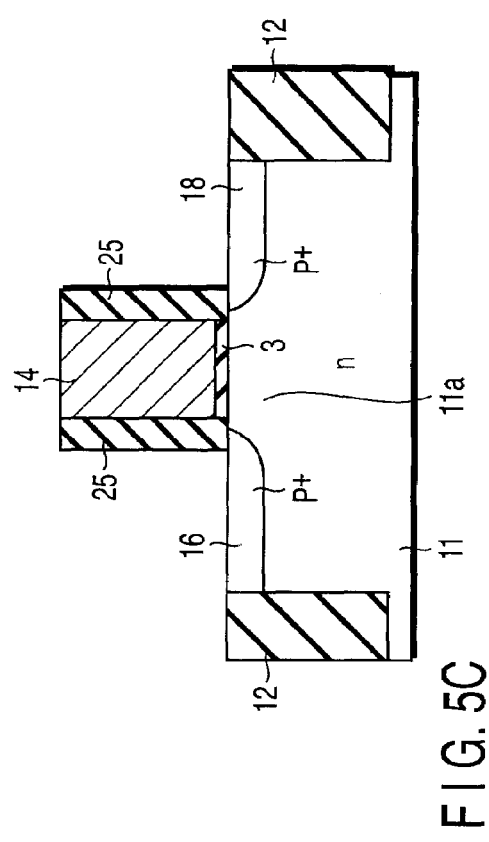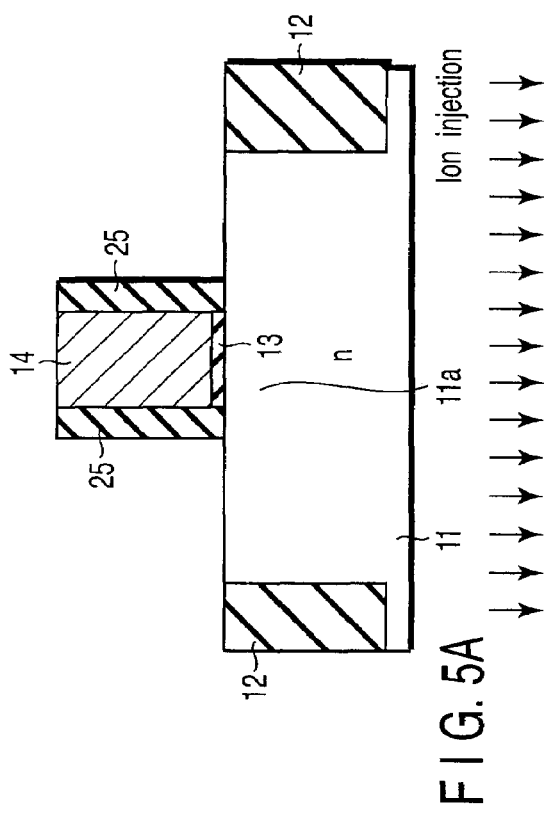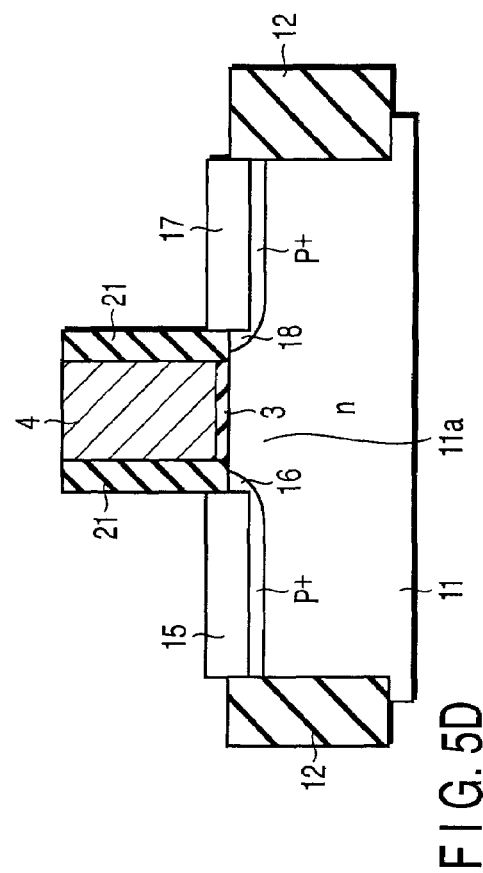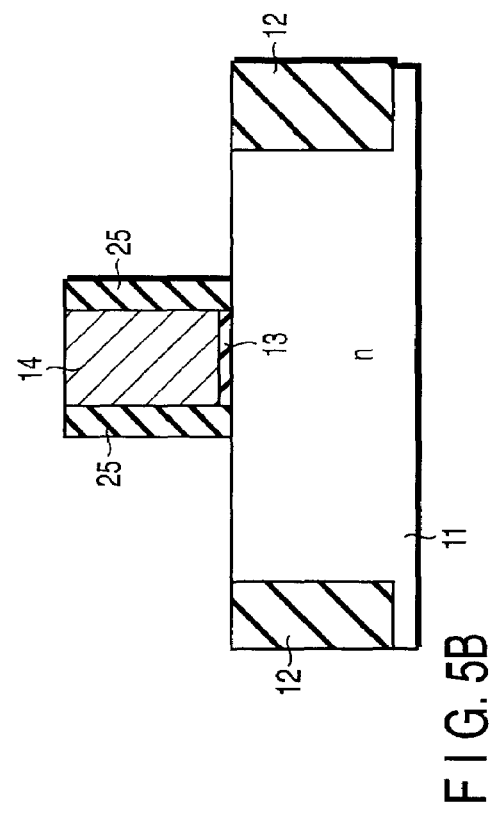

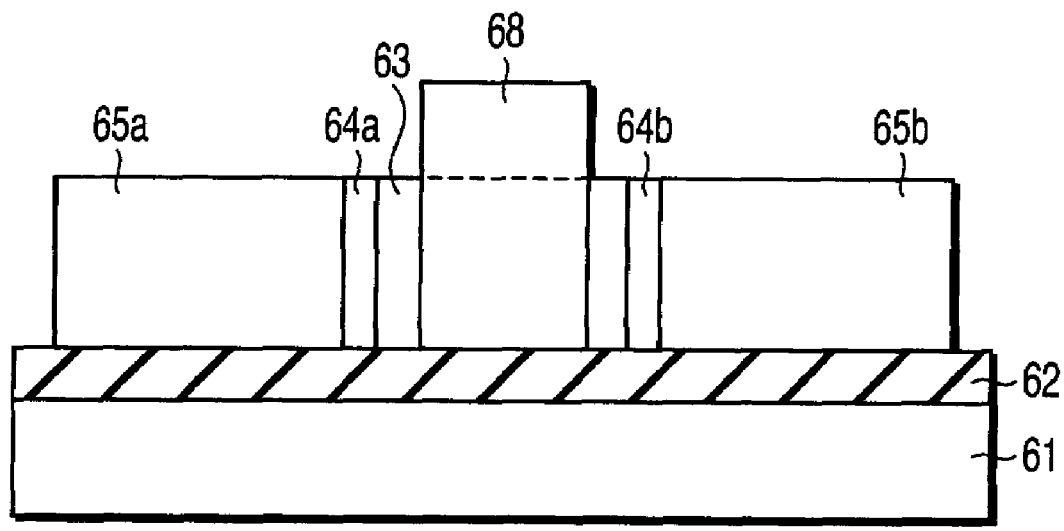
F I G. 12A
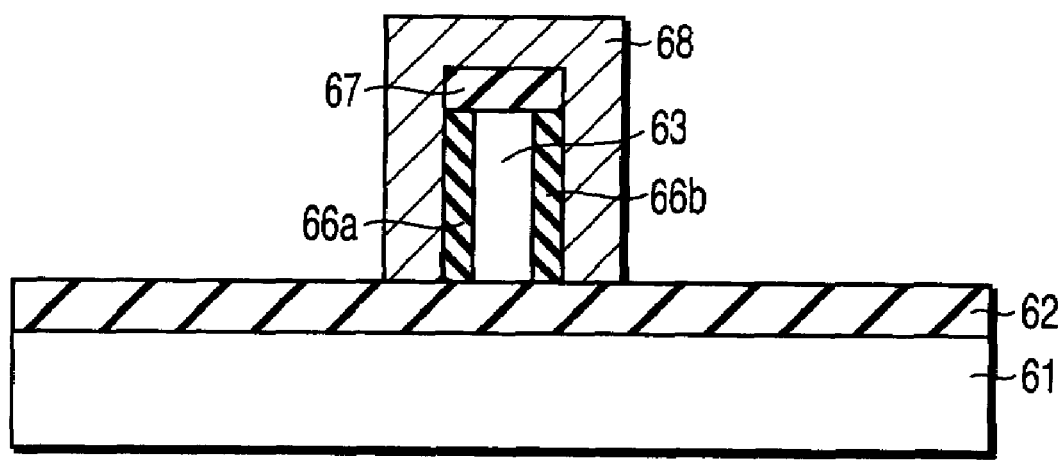
F I G. 12B

FIELD EFFECT TRANSISTOR

CROSS-REFERENCE TO RELATED APPLICATIONS

This application claims the benefit of priority from and is a divisional of application Ser. No. 11/081,348 filed Mar. 16, 2005, which is based upon and claims the benefit of priority from prior Japanese Patent Application No. 2004-092537, filed Mar. 26, 2004, the entire contents of both applications are incorporated herein by reference.

BACKGROUND OF THE INVENTION

1. Field of the Invention

The invention relates to a MIS (Metal Insulator Semiconductor) type field effect transistor configuring a semiconductor integrated circuit, and particularly to a MIS type field effect transistor, which is improved in source and drain.

2. Description of the Related Art

High performance of a field effect transistor has been achieved by microminiaturization on the basis of a scaling rule. However, in the field effect transistor whose gate length is not more than 15 nm, the source and drain whose thickness is as shallow as 10 nm and whose resistance is as low as 700 .OMEGA. are required. It is difficult to satisfy this requirement by an impurity diffused layer.

In recent years, a MOSFET wherein Schottky (metal to semiconductor) junction instead of a conventional PN junction is used for a source and a drain is proposed.

In the MOSFET of this Schottky source/drain structure, metal is used for the source and drain regions, so that an extremely shallow junction can be formed. Further, this Schottky structure has various advantages such as an extremely low parasitic resistance due to a low specific resistance, and is expected to fabricate a next generation field effect transistor.

However, in the MOSFET of this kind of Schottky source/drain structure, there is a problem that a large driving current is not provided due to a contact resistance caused by a Schottky barrier formed at an interface between a metal source/drain and a channel semiconductor. A Schottky source/drain structure that source and drain electrodes are offset with respect to a gate electrode is suggested (for example, Japanese Patent Laid-Open No. 2002-94058). There is a problem that a large driving current is not provided due to a contact resistance caused by a Schottky barrier in this device, too.

As discussed above, a field effect transistor having a Schottky source/drain structure is effective for realizing a shallow source/drain junction and decreasing a parasitic resistance. However, this kind of transistor has a problem that a large driving current is not provided due to an increase of a contact resistance caused by a Schottky barrier.

BRIEF SUMMARY OF THE INVENTION

An aspect of the present invention provides a field effect transistor comprising: a first semiconductor region forming a channel region; a gate electrode insulatively disposed over the first semiconductor region; a source electrode and a drain electrode between which the first semiconductor region is sandwiched; and second semiconductor regions each formed between the first semiconductor region and one of the source electrode and the drain electrode, and having impurity concentration higher than that of the first semiconductor region, and wherein the source electrode is offset to the gate electrode in a direction in which the source electrode and the drain electrode are separated from each other with respect to a channel direction, and one of the second semiconductor regions that is located near the source electrode has a thickness not more than a thickness with which the one of the second semiconductor regions is completely depleted in the channel direction with the source electrode being in thermal equilibrium with the one of the second semiconductor regions.

BRIEF DESCRIPTION OF THE SEVERAL VIEWS OF THE DRAWING

FIG. 1 shows a sectional view of a MIS type field effect transistor concerning the first embodiment;

FIGS. 5A to 5D show sectional views of semiconductor structures in processing stages of manufacturing a field effect transistor concerning the third embodiment;

FIGS. 12A and 12B show sectional views of a MIS type field effect transistor concerning the sixth embodiment.

DETAILED DESCRIPTION OF THE INVENTION

Figure 2:
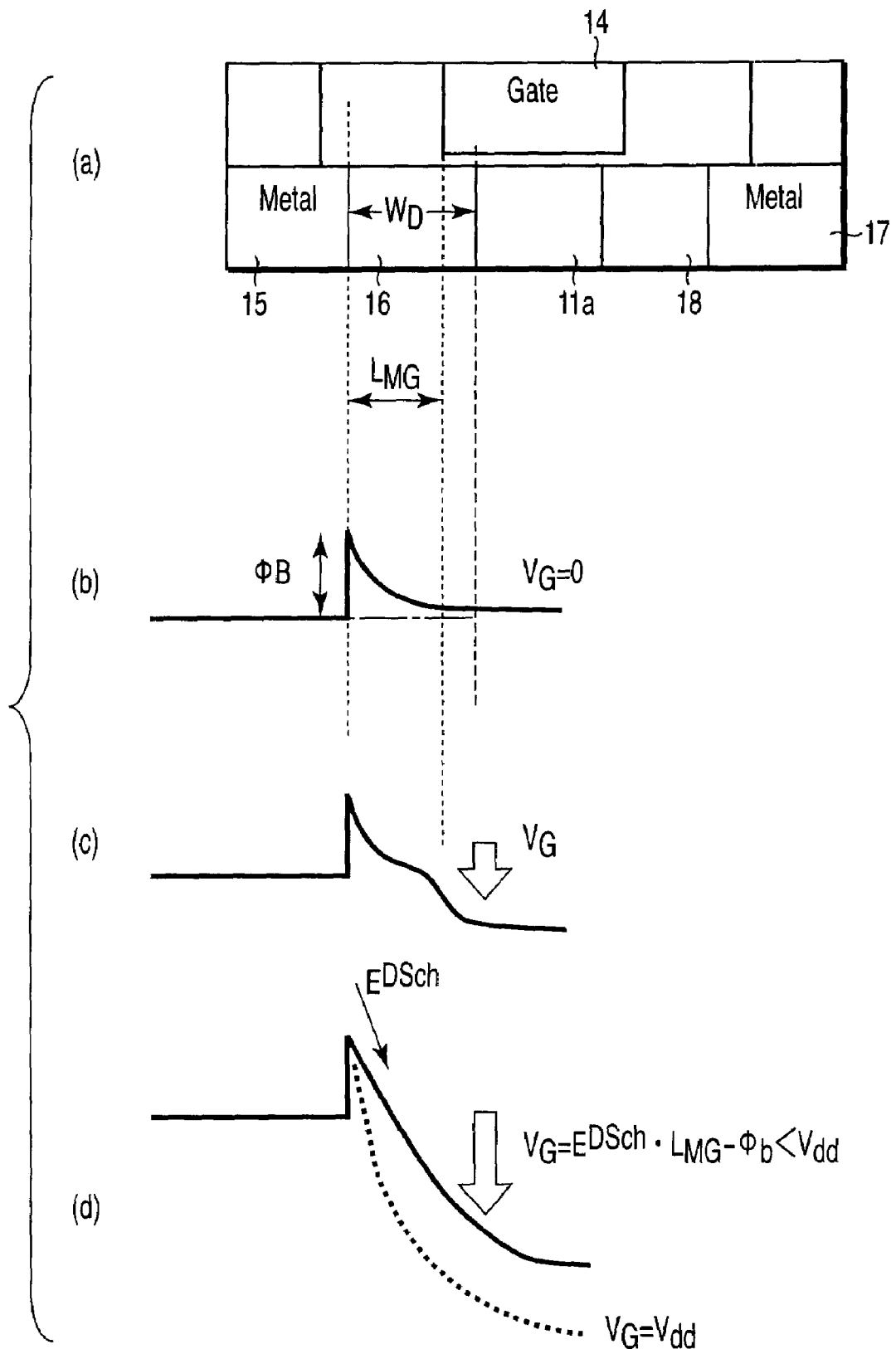
FIG. 2 is a diagram showing a change of a driving current due to offset of the source and drain electrodes.

An embodiment of the present invention will be described referring to accompanying drawings.

First Embodiment

FIG. 1 shows a sectional view of a field effect transistor concerning the first embodiment of the present invention. This transistor is a p-channel MOSFET of a Schottky source/drain structure having an additional diffused layer, the gate length is assumed 20 nm.

A device separation insulating film 12 is formed of a Si oxide film, and so on, and buried in an n type Si substrate (first semiconductor region) 11. A gate electrode 14 is formed on a channel region 11a in a device formation region surrounded by the device separation insulating film 12 with a gate insulating film 13 interposed between the channel region 11a and the gate electrode 14. A source electrode 15 and a drain electrode 17 configuring Schottky source and drain are formed in the device formation region with the channel region 11a arranged between the source and drain electrodes 15 and 17. The gate electrode 14 and the source and drain electrodes 15 and 17 are made of platinum silicide.

A source side additional diffused layer (second semiconductor region) 16 made of a p+ layer is formed between the source electrode 15 and the channel region 11a. A drain side additional diffused layer (second semiconductor region) 18 is formed between the drain electrode 17 and the channel region 11a. The additional diffused layer 16 is formed under the source electrode 15, too. The additional diffused layer 18 is formed under the drain electrode 17, too.

A gate side wall insulating film 21 is formed on the side of the gate electrode 14. An interlayer dielectric 23 is formed to cover the surface of the substrate. A contact hole used for connecting the source electrode 15 and the drain electrode 17 is formed in the interlayer dielectric 23. An electric wiring 22 is buried in the contact hole.

In the present embodiment, the source side additional diffused layer 16 must be completely depleted with the source electrode 15 being in thermal equilibrium with the additional diffused layer 16. Concretely, the barrier height $\phi b$ with respect to the silicon of platinum silicide is 0.2 eV, the peak concentration of the additional diffused layer 16 is $1\times20$ cm$^{-3}$, and the length in the channel direction Wd is 4 nm. In this condition that the additional diffused layer 16 is thermally equilibrium with the source electrode 15, it is completely depleted by the Schottky barrier.

The source electrode 15 has no overlap with an edge of the gate electrode 14 but an offset. It is a feature of the present embodiment that the length LMG of the offset is set to not more than 3 nm. As described in conjunction with FIG. 2 later, a contact resistance between the source electrode 15 and the silicon substrate is reduced by a electric field due to the gate, and a driving current increases greatly in comparison with a device without the additional diffused layer. In the embodiment of FIG. 1, the platinum silicide is used for the gate electrode 14. However, metal or polysilicon or a layered film thereof may be used for the gate electrode.

The above conditions are not required for the drain electrode 17 and the additional diffused layer 18 on the drain side. However, conventionally, since the source and drain are formed in the same shape and at the same time, the drain electrode 17 and the additional diffused layer 18 may be determined similarly to the source electrode 15 and the additional diffused layer on the source side.

The effect that the gate offset of not more than 3 nm of the MOSFET of FIG. 1 gives to electrical characteristics is described in conjunction with FIG. 2 hereinafter. FIG. 2(a) shows schematically the sectional of a MOSFET structure of FIG. 1. The longitudinal length Wd of the additional diffused layer becomes longer than LMG, but conventionally a relation of these lengths may be reversed. FIGS. 2(b), (c) and (d) show states of applying a bias of 0V to the source electrode 15. FIGS. 2(b), (c) and (d) show potential energy distributions on a part adjacent to the source end on the channel surface when various gate biases are applied to the gate. A bias larger than 0 is applied to the drain electrode 17.

FIG. 2(b) shows the situation that the work function of the source electrode 15 coincides with the fermi level of the source side additional diffused layer 16 by adjusting the gate bias. Then, the source electrode 15 is thermally equilibrium with the source side addition diffused layer 16. Concretely, if, for example, the work function of the source electrode 15 is the same as that of the gate electrode 14, 0V may be applied to the gate electrode, too, similarly to the source bias. In the other case, the gate bias may be adjusted according to a difference between the work functions of the gate electrode 14 and source electrode 15 and the thickness of the gate insulator 13.

FIG. 2(b) shows a reference of a potential distribution according to the present embodiment. In the present embodiment, the gate bias is 0V in this time.

The source side additional diffused layer 16 of the present embodiment is completely depleted by Schottky barrier $\phi b$ in a thermally equilibrium state as shown in FIG. 2(b). The Schottky barrier becomes thin due to the electric field generated by charges of the active impurity of the additional diffused layer 16, whereby a contact resistance decreases in comparison with the device having no additional diffused layer 16. This point is substantially the same as a contact resistance between silicide of the conventional MOSFET and the source diffused layer thereof. However, in the present embodiment, the additional diffused layer 16 is completely depleted by the Schottky barrier $\Phi b$, unlike the conventional MOSFET. Therefore, even if the source electrode 15 is arranged near the gate, the short channel effect is suppressed unlike the conventional device.

FIG. 2(c) shows a potential distribution when a positive gate bias is applied to the gate in the present embodiment. In the present embodiment, because the source electrode 15 is disposed near the gate edge, the potential energy on the bottom of the Schottky barrier that is near the gate end decreases. However, when the gate bias is small, the electric field of the gate does not influence the width of Schottky barrier, and the contact resistance is almost not reduced in this bias condition.

FIG. 2(d) shows a potential energy distribution when the gate bias is further applied. The doted line in FIG. 2(d) shows a potential energy distribution when the gate bias is applied to the gate to the supply voltage Vdd corresponding to the maximum of the gate bias. When the electric field of Schottky barrier increases due to the gate field as shown in FIG. 2(d), the Schottky barrier becomes thin, and thus the contact resistance decreases.

When LMG is as large as a value shown in FIG. 2(c) in the case that the gate bias is applied to the gate to Vdd, the contact resistance cannot be reduced by the gate bias.

The tolerance of LMG can be estimated by the maximum electric field in the Schottky barrier in the equilibrium state, the height of the Schottky barrier and Vdd. Vdd is preferably higher than a potential energy difference varying as the maximum electric field within the distance of LMG.

The next equation (1) is led based on such a study.

$$VG^{DSch} = E^{DSch} \times LMG - \phi b < Vdd \quad (1)$$

$E^{DSch}$ is an electric field at an interface between the source electrode 15 and the source side additional diffused layer 16 in the equilibrium state, $\phi b$ is a barrier height of the source electrode 15 with respect to the source side additional diffused layer 16, and Vdd is a power supply voltage.

LMG is defined by the following equation (2) from the equation (1) according to $\phi b$ and impurity region concentration.

$$0 < LMG < (Vdd + \phi b)/E^{DSch} \quad (2)$$

The electric field $E^{DSch}$ is defined by the following equations (3) and (4)

$$E^{DSch} = \{2qN(Vbi-kT/q)/\in s\}^{1/2} \quad (3)$$

$$Vbi = \phi b - \{Eg/2 - kT/ln(N/n\ i)\} \quad (4)$$

where q: electron charge, Eg: band gap of the channel region 11a, $\in$ s: conductivity of the channel region 11a, ni: intrinsic carrier density of the channel area 11a, T: absolute temperature, k: Boltzmann coefficient.

Accordingly, the distance (quantity of offset) between the source electrode 15 and the gate electrode 14 is preferable to be set in a range of LMG determined by the equation (2). In the present embodiment, a bulk planar structure is explained. However, substantially the same effect can be explained for a completely depleted type SOI MOSFET.

In the present invention it is essential that the electric field produced by a gate decreases the width of Schottky barrier in a MOSFET having a distribution of active impurity charges on the channel side of a metal source, thereby to reduce a contact resistance. Accordingly, a relation between the source electrode 15, the additional diffused layer 16 and the gate electrode 14 is not limited to the structure of FIG. 1. For example, a plurality of steps caused by processing may exist on the silicon surface near the gate electrode 14.

Further, the gate electrode 14 and the source electrode 15 must not be located on the same plane, and may be arranged with an angle with respect to each other. The present invention can be applied to, for example, a device wherein a current flows along a plane perpendicular to a substrate, so-called a FIN-FET. If the electric field of the gate electrode 14 arrives at an interface between the silicon and the source electrode 16 on a current path, the effect of the present invention is provided substantially.

In this way the present embodiment has advantages that the length of offset between the gate electrode 14 and the source electrode 15 is assumed not more than 3 nm, the structure that a Schottky contact resistance is reduced by the electric field of the gate electrode 14 is realized, and the present device has a source to drain resistance lower than that of the diffused source and drain similarly to a conventional Schottky source drain structure MOSFET.

The present embodiment is described for a p-channel MOSFET, but can apply to an n-channel MOSFET by reversing polarities of impurity and voltage to realize a high-performance CMOS. In this way, the MISFET structure of the present embodiment realizes an integrated circuit of a high-performance, low power consumption.

In the present embodiment, the offset between the source and drain electrodes and the thickness of the additional diffused layer are prescribed on the source side particularly. However, the same may be applied to the drain side.

To be exact, the drain side needs not always have the same structure as the source side, but the drain and source sides are preferable to be identical in view of forming the source and drain at the same time.

Second Embodiment

There will be explained a method of setting a tolerance of a distance LMG between the gate electrode 14 and the source electrode 15 in the MOSFET shown in FIG. 1 as the second embodiment of the present invention.

Figure 3:
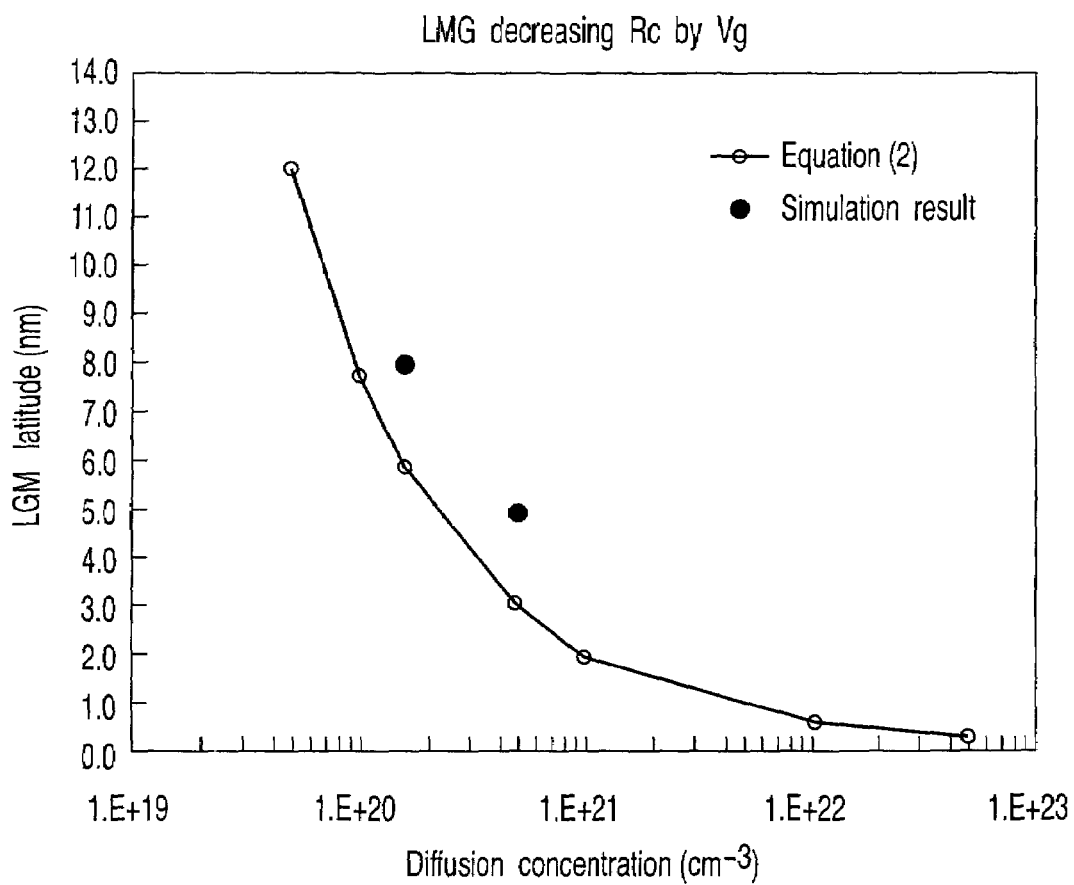
FIG. 3 is a diagram for explaining the second embodiment, which shows a relation between a distribution of field intensity in a channel-length direction according to an offset distance and a maximum value thereof.

FIG. 3 shows a graph for obtaining the tolerance of the distance LMG between the gate electrode 14 and the source electrode 15 according to Schottky barrier height. The horizontal axis shows the impurity concentration of the additional diffused layer 16, and the vertical axis shows the distance LMG.

The MOSFET of the present embodiment can use an additional diffused layer concentration higher than that of the first embodiment as seen from the graph of FIG. 3. Then, since the maximum electric field of Schottky barrier increases, it is necessary to approximate the source electrode 15 to the gate electrode 14 in order to control the Schottky barrier width with the electric field of the gate.

In the graph of FIG. 3, in the case that the equation (1) is transformed to the equation (2), Vdd=0.85V, and barrier height=0.1 eV, the additional diffused layer concentration dependency of the tolerance of LMG is derived. The difference between a work function of the gate and a work function of the source electrode is ignored in deriving the equation (2) and FIG. 3. Further, the tolerance of LMG is calculated using the maximum electric field of Schottky barrier without the detail of the potential distribution based on the gate bias.

In the present embodiment, the tolerance of LMG varies more than one digit corresponding to the Schottky barrier height and additional diffused layer concentration.

Simulation for a device wherein the additional diffused layer of the present invention is applied to metal source and drain is done using device simulation. The value of LMG that indicates a high driving current at this time is shown in a black dot mark in FIG. 3. In the device simulation, an operation of a MOSFET on an applied gate bias and drain bias is computed considering a value of a current flowing through the Schottky barrier by tunneling. The features obtained by the MOSFET structure of the present embodiment are reflected in detail. As shown in the black dot marks of FIG. 3, the result depending on the additional diffused layer concentration similarly to the solid line obtained by the equation (2) is provided. Considering the simulation resultant, various parameters are preferably assumed for the MOSFET of the present embodiment to get a high driving current at the time of barrier height about 0.1 eV as follows:

(1) LMG is preferably assumed to be not more than 12 nm when the concentration of the additional diffused layer is not less than $5 \times 10^{19}$ cm$^{-3}$.

(2) LMG is preferably assumed to be not more than 8 nm when the concentration of the additional diffused layer is not less than $1.5 \times 10^{20}$ cm$^{-3}$.

(3) LMG is preferably assumed to be not more than 1 nm when the concentration of the additional diffused layer is not less than $1 \times 10^{22}$ cm$^{-3}$.

Figure 4:
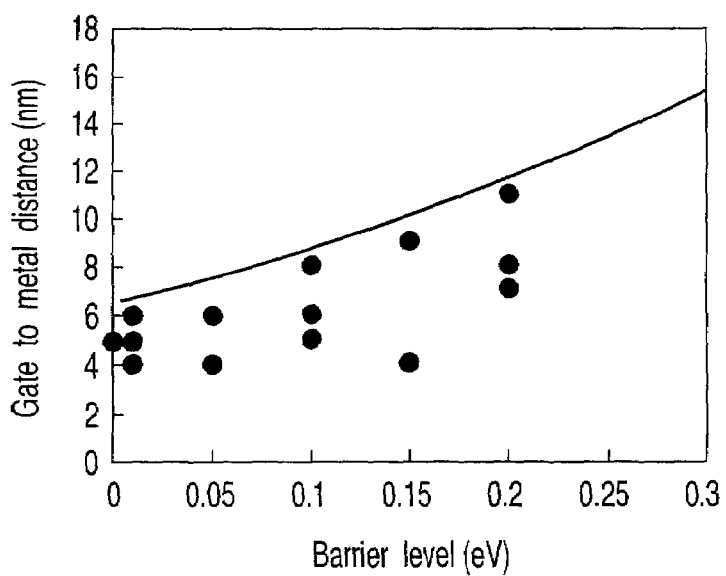
FIG. 4 is a diagram for explaining the second embodiment, which shows a barrier height dependency of a MIS FET.

FIG. 4 shows dependency of barrier height on a desirable value of LMG based on a simulation result obtained by simulation similar to that shown in black dot marks in FIG. 3 using the device simulation.

In the simulation shown in FIG. 4, the active concentration peak value of the additional diffused layer is determined to a value between $5 \times 10^{19}$ cm$^{-3}$ and $5 \times 10^{20}$ cm$^{-3}$.

(4) LMG is preferably assumed to be not more than 16 nm when the barrier height is not more than 0.3 eV.

(5) LMG is preferably assumed to be not more than 12 nm when the barrier height is not more than 0.2 eV.

(6) LMG is preferably assumed to be not more than 8 nm when the barrier height is not more than 0.1 eV.

The value of optimum distance LMG within the range is determined by balance between a driving current depending on a contact resistance and a short channel effect according to design, using experimental manufacture and analysis such as device simulation. Although the contact resistance decreases as LMG decreases, the short channel effect deteriorate. When Vdd is smaller than 0.85V, the value of appropriate LMG is within the above range. When Vdd is higher than 0.85V, LMG may be occasionally larger than the range. LMG may be determined according to design condition referring to the above range.

The inequality of the equation (2) assumes that distance LMG is a positive value substantially. What LMG is positive intends that the atom of edge of a source metal structure near the substrate surface on the channel portion offsets with respect to the atom of edge forming a gate electrode structure of the gate edge. This circumstance can be ensured by observing the neighborhood of the source metal edge with cross sectional TEM photographs, and so on.

When impurity is introduced generally in high concentration, charge distribution caused by electrical activation is limited to not more than solid solubility limit of the impurity according to the introduction process. When the introduced impurity concentration is not completely activated, activity impurity concentration is used rather than chemical concentration. The impurity concentration in the present invention means activity impurity concentration producing charge distribution. The impurity introduced in the semiconductor layer may be not completely electrically activated.

In the present embodiment, the feature of the additional diffused layer is expressed by an index referred to as concentration. However, in the present embodiment, when charges due to the impurity atom are included in the silicon region adjacent to the source electrode according to Schottky barrier height essentially, it is necessary to decrease LMG with an increase in the number of charges. Accordingly, it is not always necessary to derive a value of impurity concentration in the present embodiment. It is essential to use LMG that Schottky barrier thinned due to the impurity charges is further thinned by an electric field generated by the gate in operation.

The present embodiment is described for the case of p-channel MOSFET. However, a relation between the Schottky barrier height, the additional diffused layer concentration and the electric field caused by the Schottky barrier is the same as that of the n-channel MOSFET. Accordingly, the present embodiment can apply to the n-channel MOSFET by considering a sign corresponding to a polarity.

Third Embodiment

The third embodiment of the present invention will be described on a method of manufacturing a MOSFET of FIG. 1 referring to FIGS. 5A to 5D.

A device separation insulating film 12 is buried in a device isolating region of an n type Si substrate 11 by a known method as shown in FIG. 5(a). After formation of a sacrifice oxide film of around 5 nm, a channel impurity for controlling a threshold voltage is introduced in the substrate by an ion implantation (not shown).

After exfoliation of the sacrifice oxide film, a gate insulator 13 of an effective oxide film thickness around 1 nm is formed on the substrate 11. A gate electrode 14 is formed by a method of lithography. Subsequently, a TEOS film for forming an offset spacer is deposited on the gate electrode and the substrate, and an offset spacer 25 is formed around the gate electrode 14 by a side wall remaining method using anisotropic etching.

An ion implantation is done by $BF_2$ of, for example 1.5 keV to form source and drain additional diffused layers 16 and 18 as shown in FIG. 5(b). In this time, the thickness of the offset spacer 25 and a condition of the ion implantation, and a condition of following activation annealing are selected such that the additional diffused layer is completely depleted by the Schottky barrier caused by metals as source and drain electrodes 15 and 17 to be formed later. For the purpose of controlling a threshold voltage further and suppressing a short channel effect, an angular ion implantation is done using the gate electrode 14 and the offset spacer 25 as a mask, so-called halo impurity may be introduced in the channel region.

Subsequently, an activation anneal is done by, for example, a flash lamp anneal, and the impurity for formation of the source and drain additional diffused layers is activated to form the additional diffused layer regions 16 and 18 while controlling lateral diffusion as shown in FIG. 5(c). The impurity concentration of an additional diffused layer region 16 adjacent to a source electrode 15 to be formed later is controlled to be $1\times10^{20}$ $cm^{-3}$ finally.

After removal of the offset spacer 25, a gate side wall insulating film 21 is formed around the gate electrode 14 by a side wall remaining method as shown in FIG. 5(d). The thickness of the side wall insulating film 21 is set at 4 nm. After an Ni film is deposited by sputtering using the side wall insulating film 21 as a mask, an anneal is done to form source and drain metal regions (source electrode 15 and drain electrode 17) of nickel silicide. In this time, a gate electric field in operation thins the Schottky barrier on the source edge and reduces a contact resistance.

Subsequently, an interlayer dielectric 23 is deposited on the entire surface, the surface is flattened by a chemical and mechanical polishing method (CMP method) (not shown), and a contact hole for forming electric wiring 22 therein is formed by a lithography method. Further, an electrical conduction film for the electric wiring 22 is deposited, and the surface is flattened by CMP method. In this way, a MOSFET of one-device as shown in FIG. 1 is fabricated. After this process, a circuit (not shown) connected to the electric wiring 22 is formed to fabricate an integrated circuit along with other devices.

In the present embodiment, the offset spacer 25 formed once to determine the position of the additional diffused layer 16 is exfoliated in order to adjust the lateral length of the additional diffused layer 16 and the position of the source electrode 15, and the second spacer (side wall insulating film 21) for determining the position of the source electrode 15 is formed. However, the offset spacer 25 may be not exfoliated but thinned by wet etching, for example, to use it as the second spacer. Further, when the position of the source electrode 15 may be separated from the gate further, for example, the additional diffused layer concentration is low or the Schottky barrier height is higher, the position of the source electrode 15 may be determined not by exfoliating the offset spacer 25 to remain it but by depositing the second spacer thereon as adjusting the thickness of the second spacer.

In any case, the position of the source electrode 15 and the relation between the distribution of the additional diffused layer 16 and the gate position are controlled by combination of the thickness of the offset spacer and the second spacer so that the gate electric field controls the thickness of Schottky barrier on the source edge at the time of operation, corresponding to the impurity distribution of the additional diffused layer and the barrier height of the source electrode 15.

In this way, an integrated circuit of a high-performance can be realized by use of a MOSFET of a Schottky source/drain structure that a contact resistance is controlled by a gate bias.

Fourth Embodiment

Figure 6:
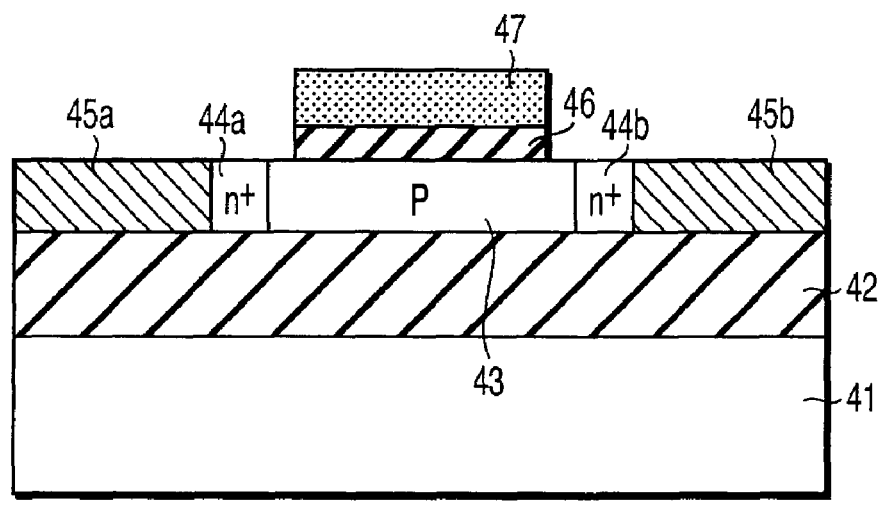
FIG. 6 shows a sectional view of a MIS type field effect transistor concerning the fourth embodiment.

FIG. 6 shows a sectional view of a field effect transistor concerning the fourth embodiment of the present invention. This embodiment provides an n-channel MOS FET having Schottky source and drain on a SOI structure.

A buried insulating film 42 made of a Si oxide film, and so on is formed in a Si substrate 41. On this buried insulating film 42 are formed a first semiconductor region 43, second semiconductor regions 44 (44a, 44b) and metal source and drain electrodes 45 (45a, 45b). A gate electrode 47 is formed on the first semiconductor region 43 with a gate insulator 46 interposed between the first semiconductor region 43 and the gate electrode 47.

The first semiconductor region 43 is a p type layer of low concentration, for example, and forms a channel region. The second semiconductor regions 44 are n+ type layers doped with, for example As in high concentration, sandwich the first semiconductor region 43 from a channel-length direction, and are formed extremely thinly to be substantially completely depleted. The source and drain electrodes 45 are made of metals or silicide, sandwich the first and the second semiconductor regions 43 and 44 in the channel-length direction, and form Schottky barrier with respect to the second semiconductor regions 44.

In the present embodiment, it is essential that the source and drain electrodes 45 is offset with respect to the gate electrode 47. The width of the second semiconductor regions 44 substantially equals the width of the depletion layer formed by the second semiconductor regions 44 and the source and drain electrodes 45 or not more than the width of the depletion layer, when the impurity concentration of the regions is uniform. The source and drain electrodes 45 are arranged at the furthest position from the gate electrode within a range in which the electric field in the channel-length direction from the second semiconductor region 44 to the first semiconductor region 43 increases or decreases in monotone.

Figure 7:
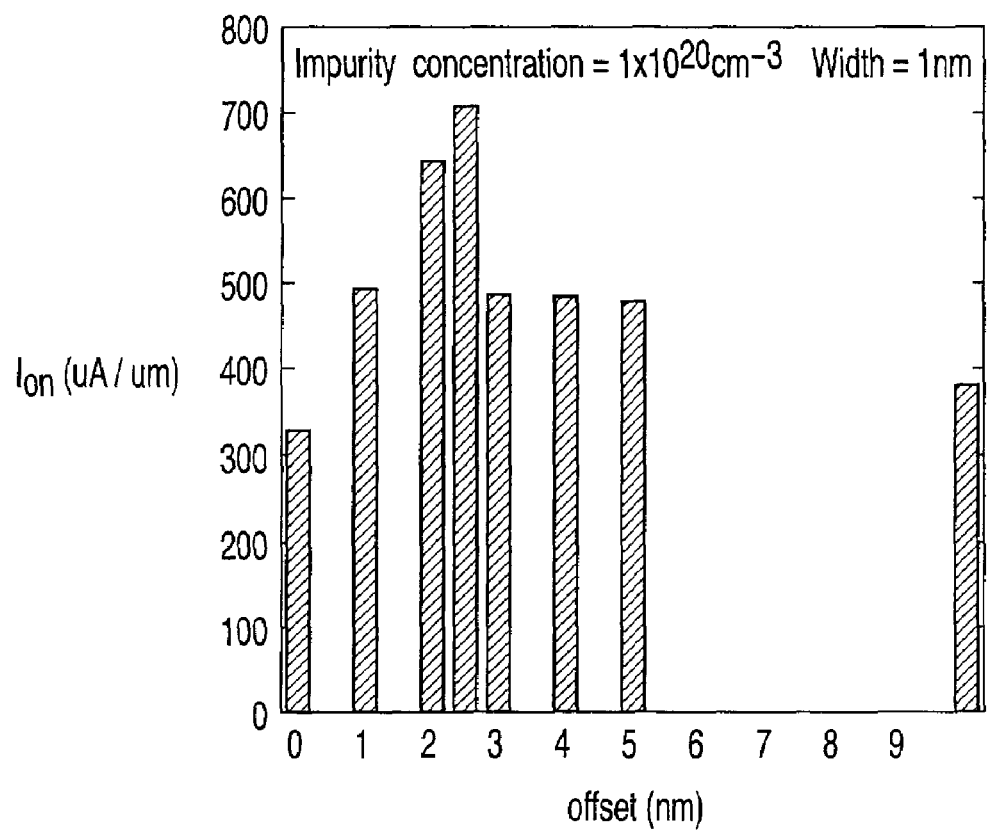
FIG. 7 is a diagram showing a change of a driving current due to offset of source and drain electrodes.

FIG. 7 shows a simulation result of a relation between an offset distance and a driving current when setting an off leakage current to 100 nA/μm by adjusting a work function of the gate when the Schottky barrier formed by the second semiconductor regions 44 of impurity concentration $1 \times 10^{20}$ cm$^{-3}$ and width 1 nm and the drain electrodes 45 is 0.1 eV. The driving current increases when an offset is in a range of 1-5 nm, and decreases when an offset is 9 nm, and driving current becomes small. This matches with a result on the tolerance of LMG explained in the second embodiment.

In other words, in FIG. 3, a desirable distance LMG is 8 nm when Schottky barrier is 0.1 eV and the additional diffused layer 16 has concentration $1 \times 10^{20}$ cm$^{-3}$, the driving current increases when the offset of the present embodiment is data of 1-5 nm, and decreases when the offset is 9 nm. This coincides with the description of FIG. 3.

In this time, the width W of the depletion layer is expressed by the following equation (5) using concentration N of the second semiconductor region 44, dielectric constant ∈ s of semiconductor, band gap Eg, and elementary charge q, and is about 1 nm.

$$W = (\in s\, Eg/qN)^{1/2} \quad (5)$$

Figure 8:
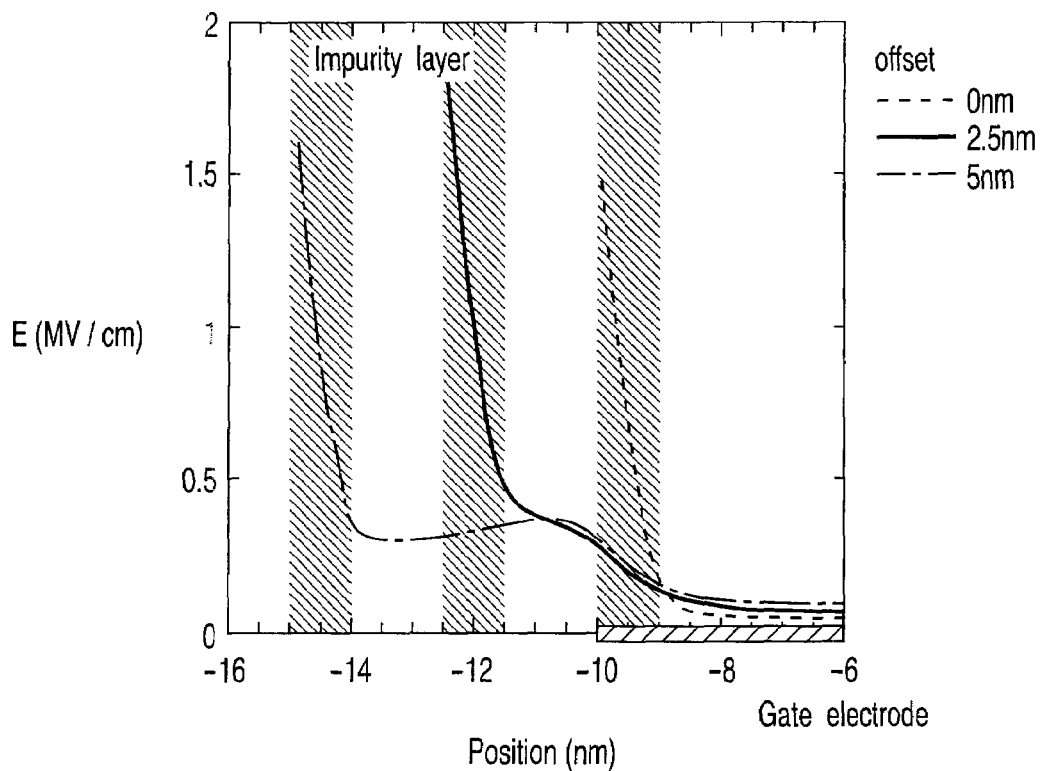
FIG. 8 shows a relation between a distribution of field intensity in a channel-length direction according to an offset distance and a max value thereof.
Figure 9:
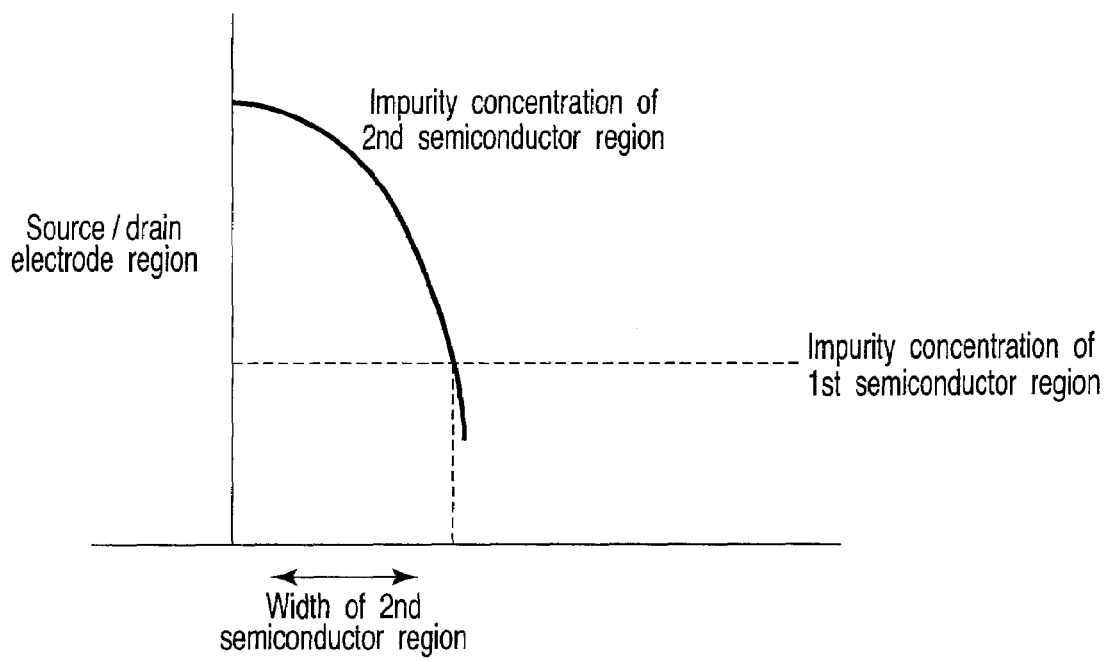
FIG. 9 is a diagram illustrating a definition of a width of a second semiconductor region whose impurity concentration has a profile.

A simulation result of field intensity in a channel direction at an interface between the source electrode 45a and the second semi-conductor region 44a is shown in FIG. 8.

It is found from FIG. 7 that the driving current increases by offset and has a peak. In the offset distance by which this driving current becomes maximum, the field intensity at the edge of the source electrode 45a becomes maximum as shown in FIG. 8, and the channel-length direction electric field intensity is at a position furthest from the gate electrode 47 in a range tc decrease in monotone. Accordingly, it is found that the maximum driving current is obtained in the Schottky MOSFET that the offset is set to 2.5 nm.

When impurity concentration has a profile, the distance from the interface between the source and drain electrodes 45 and the second semiconductor region 44 to a point at which the impurity concentration of the second semiconductor region equals to that of the first semiconductor region 43 is defined as the second semiconductor region 44. The width of the second semiconductor region 45 is set to a width by which the dose quantity of this second semiconductor region in the channel-length direction equals to the dose quantity when the impurity concentration at the interface between the source and drain electrodes 45 and the second semiconductor region 44 is uniformed and its distribution is flat and the region 44 is completely depleted.

In this way according to the present embodiment, in a n-channel MOS FET having Schottky source and drain on a SOI structure, an n+ type semiconductor layer formed of the second semiconductor region 44 is formed between the p type channel region formed of the first semiconductor region 43 and the source and drain electrodes 45. The source and drain electrodes 45 are offset with respect to the gate electrode 47 in the channel direction, and the thickness of the n+ type semiconductor layer is set to not more than a thickness in which the n+ type semiconductor layer is completely depleted in the channel-length when the source and drain electrodes 45 and the n+ type semiconductor layer are counterpoised. Therefore, a contact resistance can be reduced even by using the Schottky source/drain structure. In other words, the contact resistance can be reduced even by using Schottky source/drain structure for the purposed of realizing a shallow source/drain junction and decreasing a parasitic resistance, whereby the improvement of the driving force can be realized.

Fifth Embodiment

Figure 10:
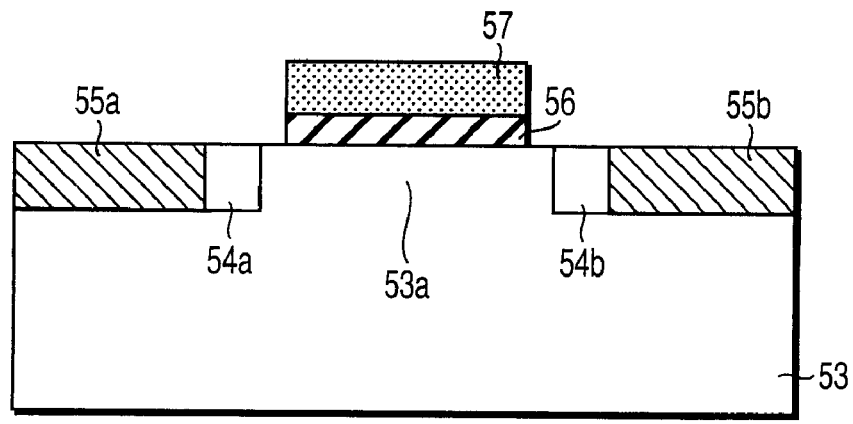
FIG. 10 shows a sectional view of a MIS type field effect transistor concerning the fifth embodiment.

FIG. 10 shows a sectional view of a field effect transistor concerning the fifth embodiment of the present invention. The present embodiment is an embodiment of fabricating a MOSFET of Schottky source/drain structure not on a SOI but on a Si substrate. This is basically the same as the structure of FIG. 6, but the second semiconductor region is formed not under the source and drain electrodes but only on the side of the source and drain electrodes.

On the face of a Si substrate 53 forming of a first semiconductor region are second semiconductor regions 54 (54a, 54b) and metal source and drain electrodes 55 (55a, 55b). A gate electrode 57 is disposed over the semiconductor region 53 with a gate insulator 56 interposed between the gate electrode 57 and the semiconductor region 53.

The first semiconductor region 53 is, for example, a p type layer of low concentration, and forms a channel region 53a. The second semiconductor regions 54 are n+ type layers doped with, for example, As at high concentration, sandwich the channel area 53a in the channel-length direction, and are formed extremely thinly to be depleted substantially completely. The source and drain electrodes 55a, 55b are made of metal or silicide, sandwich the second semiconductor regions 54a, 54b in the channel-length direction, and form Schottky barriers with respect to the semiconductor regions 54a, 54b.

In the present embodiment, it is essential that the source and drain electrodes 55a, 55b offset with respect to the gate electrode 57 similarly to the fourth embodiment. The width of each of the second semiconductor regions 54a, 54b and the location of the source and drain electrodes 55a, 55b are substantially the same as the fourth embodiment.

The structure of the present embodiment can reduce a contact resistance even by using the Schottky source/drain structure, and provide an effect similar to that of the fourth embodiment.

Sixth Embodiment

Figure 11:
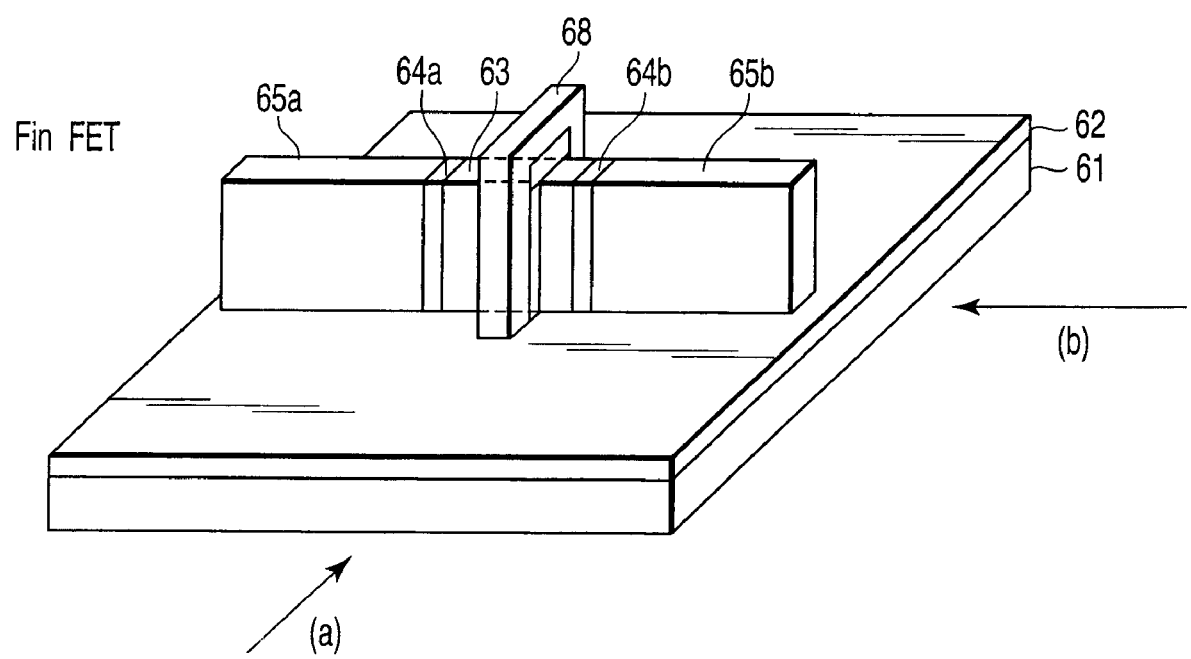
FIG. 11 shows a perspective view of a MIS type field effect transistor concerning the sixth embodiment.

FIG. 11 shows a perspective view of a field effect transistor concerning the sixth embodiment of the present invention. FIGS. 12A and 12B show sectional views of the field effect transistor along 12A-12A and 12B-12B lines of FIG. 11.

The present embodiment applies to a Fin type structure. A buried insulating film 62 made of a Si oxide film is formed on a Si substrate 61. On this pad insulating film 62 are formed first and second semiconductor regions 63 and 64a, 64b and metal source and drain electrodes 65a, 65b. Gate insulators 66a, 66b and an insulating film 67 are formed to surround the first semiconductor region 63. Further, a gate electrode 68 is formed to surround them.

The first semiconductor region 63 is a p type layer, for example, and forms a channel region. The second semiconductor regions 64a, 64b are n+ layers doped with, for example, As in high concentration, sandwich the first semiconductor region 63 in a channel-length direction, and formed extremely thinly to be substantially completely depleted. The source and drain electrodes 65 are made of metal or silicide, sandwich the first and second semiconductor regions 63 and 64a, 64b in a channel-length direction, and form Schottky barriers with respect to the semiconductor regions 64a, 64b.

In the present embodiment, the source and drain electrodes 65a, 65b are offset with respect to the gate electrode 68 in the channel-length direction, and the second semiconductor regions 64a, 64b are formed sufficiently thinly so that they are completely depleted in the channel-length direction with the semiconductor regions 64a, 64b being in thermal equilibrium with the source and drain electrodes 65a, 65b. The structure of the present embodiment can reduce a contact resistance even by using the Schottky source/drain structure, and provide an effect similar to that of the third embodiment.

Further, in the present embodiment, the buried insulating film 62 is not always necessary, and the first and second semiconductor regions 63 and 64a, 64b, the metal source and drain electrodes 65a, 65b, the gate insulator 66, and the insulating film 67, and the gate electrode 68 may be formed directly on the Si substrate 61. Further, the insulating film 67 may be used as a gate insulator by being made of the same material as the gate insulator 66 in the same thickness as it.

In the embodiments, Si is used as semiconductor material, but silicon germanium (Si Ge), germanium (Ge), silicon carbide (SiC), gallium arsenide (Ga As), and aluminum nitride (AlN) may be used. The first semiconductor region and the second semiconductor region do not need to be of opposite conductivity types, and may be of an identical conductivity type with different impurity concentrations.

The present invention is not limited to a normal metal-insulator-semiconductor structure, and can apply to every MIS type field effect transistor of three-dimensional types such as Fin type structure or double gate structure.

According to the present invention, the source and drain electrodes (metal source and drain regions) are offset with respect to the gate electrode in the channel-length direction, and the second semiconductor region is set to not more than a thickness by which it is completely depleted in the channel-length direction with the source electrode being in thermal equilibrium with the second semiconductor region. This is considered to be a structure that the metal source and drain regions are offset with respect to the gate electrode in the MIS type field effect transistor that the second semiconductor region is completely depleted. Such a structure can provide a large driving current in comparison with a device having no offset or overlapped devices when off leakage current values are equalized.

In other words, the contact resistance can be reduced even by using Schottky source/drain structure for the purposed of realizing a shallow source/drain junction and decreasing a parasitic resistance, whereby the improvement of the driving force can be realized. As a result, a semiconductor device operating at high speed with low power consumption can be realized.

When the metal source and drain regions are arranged at the boundary of a range covered by an electric field produced by a voltage applied to the gate electrode, the field intensity at the source end becomes maximum to allow an increase of a ratio between the driving current and the off leakage current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field effect transistor comprising;
a first semiconductor region forming a channel region;
a gate electrode insulatively disposed over the first semiconductor region;
source and drain electrodes sandwiching the first semiconductor region in a channel-length direction; and
second semiconductor regions each having impurity concentration higher than that of the first semiconductor region, one of the second semiconductor regions being formed between the first semiconductor region and the source electrode and another of the second semiconductor regions being formed between the first semiconductor region and the drain electrode, wherein
the source and drain electrodes are offset to the gate electrode in a direction in which the source and drain electrodes are separated from each other in a channel direction, and
the second semiconductor regions each have a thickness not more than a thickness with which they are substantially completely depleted with the source and drain electrodes being in thermal equilibrium with the second semiconductor regions.

2. The field effect transistor according to claim 1, wherein a distance LMG between the source electrode and the gate electrode along a channel-length direction satisfies a following condition:

$$0 < LMG < (Vdd + \phi b)/E^{DSch}$$

where $E^{DSch}$ represents an electric field at an interface between the one of the second semiconductor regions and the source electrode in thermal equilibrium, Vdd represents a supply voltage, and $\phi b$ represents a barrier height of the source electrode with respect to the one of the second semiconductor regions.

3. The field effect transistor according to claim 2, wherein the electric field $E^{DSch}$ is defined by following equations:

$$E^{DSch} = (2qN(Vbi - kT/q)/\in s)^{1/2}$$

$$Vbi = \phi b - \{Eg/2 - kT \times \ln(N/ni)\}$$

where q represents electronic charge, Eg presents a band gap of a channel of the first semiconductor region, $\in s$ represents dielectric constant of the channel of the first semiconductor region, ni represents intrinsic carrier concentration of the channel of the first semiconductor region, T represents absolute temperature, k represents Boltzmann coefficient, and N represents impurity concentration of the second semiconductor regions.

4. The field effect transistor according to claim 2, wherein an electric field in a channel-length direction from each of the second semiconductor regions to the first semiconductor region increases or decreases in monotone.

5. The field effect transistor according to claim 2, wherein the first semiconductor region edge of each of the second semiconductor regions is located in a range covered by an electric field produced by a voltage applied to the gate electrode in the first semiconductor region.

6. The field effect transistor according to claim 2, wherein the first semiconductor region, the second semiconductor regions, the source electrode and the drain electrode are formed on an insulating film.

7. The field effect transistor according to claim 1, wherein the first semiconductor region and second semiconductor regions are made of Si, and the source electrode and the drain electrode are made of metal or metal silicide.

8. The field effect transistor according to claim 1, wherein an electric field in a channel-length direction from each of the second semiconductor regions to the first semiconductor region increases or decreases in monotone.

9. The field effect transistor according to claim 1, wherein the first semiconductor region edge of each of the second semiconductor regions is located in a range covered by an electric field produced by a voltage applied to the gate electrode in the first semiconductor region.

10. The field effect transistor according to claim 1, wherein the first semiconductor region, the second semiconductor regions, the source electrodes and the drain electrode are formed on an insulating film.

11. The field effect transistor according to claim 1, wherein the first semiconductor region and the second semiconductor regions are made of Si, and the source and drain electrodes are made of metal or metal silicide.

* * * * *